United States Patent
Kim et al.

(10) Patent No.: US 12,024,654 B2
(45) Date of Patent: Jul. 2, 2024

(54) NON-CONDUCTIVE FILM AND MANUFACTURING METHOD OF SEMICONDUCTOR LAMINATE

(71) Applicant: LG CHEM, LTD., Seoul (KR)

(72) Inventors: Eun Yeong Kim, Daejeon (KR); You Jin Kyung, Daejeon (KR); Kwang Joo Lee, Daejeon (KR); Ji Ho Han, Daejeon (KR); Bora Yeon, Daejeon (KR); Mi Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 594 days.

(21) Appl. No.: 17/286,673

(22) PCT Filed: Jun. 12, 2020

(86) PCT No.: PCT/KR2020/007665
§ 371 (c)(1),
(2) Date: Apr. 19, 2021

(87) PCT Pub. No.: WO2020/251307
PCT Pub. Date: Dec. 17, 2020

(65) Prior Publication Data
US 2021/0388244 A1    Dec. 16, 2021

(30) Foreign Application Priority Data

Jun. 13, 2019 (KR) .......... 10-2019-0070250
Jun. 12, 2020 (KR) .......... 10-2020-0071597

(51) Int. Cl.
| | | |
|---|---|---|
| C09J 163/00 | (2006.01) | |
| C09J 7/24 | (2018.01) | |
| H01L 23/00 | (2006.01) | |
| C08K 5/29 | (2006.01) | |
| C09J 7/40 | (2018.01) | |

(52) U.S. Cl.
CPC ............ *C09J 163/00* (2013.01); *C09J 7/245* (2018.01); *H01L 24/27* (2013.01); *H01L 24/29* (2013.01); *C08K 5/29* (2013.01); *C09J 7/40* (2018.01); *C09J 2433/00* (2013.01); *H01L 2224/29025* (2013.01); *H01L 2224/2919* (2013.01); *H01L 2924/0665* (2013.01)

(58) Field of Classification Search
CPC .... C09J 163/00; C09J 7/245; C09J 2301/312; C09J 7/10; C09J 133/08; C09J 7/00; C09J 11/06; C09J 133/10; C09J 2463/00; C09J 175/16; C09J 2301/208; C09J 2301/1242; C09J 175/14; C09J 2203/326; C09J 2433/00; C09J 7/40; H01L 2924/0665; H01L 2224/2919; H01L 2224/29025; H01L 24/27; H01L 24/29; C08G 18/6229; C08F 220/1808; C08K 5/29

See application file for complete search history.

(56) References Cited

U.S. PATENT DOCUMENTS

| | | |
|---|---|---|
| 5,110,388 A | 5/1992 | Komiyama et al. |
| 5,118,567 A | 6/1992 | Komiyama et al. |
| 5,356,949 A | 10/1994 | Komiyama et al. |
| 9,695,345 B2 | 7/2017 | Yoo et al. |
| 9,953,945 B2 | 4/2018 | Kim et al. |
| 10,526,513 B2 | 1/2020 | Kim et al. |
| 2010/0233409 A1 | 9/2010 | Kamiya et al. |
| 2010/0239866 A1 | 9/2010 | Matsumura et al. |
| 2011/0037180 A1* | 2/2011 | Yoo .......... C08K 5/13 257/E23.003 |
| 2011/0151195 A1 | 6/2011 | Mitsukura et al. |
| 2017/0198182 A1* | 7/2017 | Kim .......... B32B 27/34 |
| 2017/0233610 A1 | 8/2017 | Kim et al. |
| 2019/0043748 A1 | 2/2019 | Kim et al. |
| 2022/0135828 A1 | 5/2022 | Yamagishi et al. |

FOREIGN PATENT DOCUMENTS

| | | |
|---|---|---|
| CN | 106661412 A | 5/2017 |
| CN | 107353837 A | 11/2017 |
| CN | 108174606 A | 6/2018 |
| CN | 108735651 A | 11/2018 |
| JP | 4369584 B2 | 11/2009 |
| JP | 2018-182294 A | 11/2018 |
| KR | 10-1995-0009551 B1 | 8/1995 |
| KR | 10-2009-0070893 A | 7/2009 |
| KR | 10-2010-0034726 A | 4/2010 |
| KR | 10-2010-0067916 A | 6/2010 |
| KR | 10-2010-0134738 A | 12/2010 |
| KR | 10-2011-0036749 A | 4/2011 |
| KR | 10-1089631 B1 | 12/2011 |
| KR | 10-1435758 B1 | 8/2014 |
| KR | 10-1462845 B1 | 11/2014 |
| KR | 2014-0129921 | * 11/2014 |
| KR | 10-2015-0072343 A | 6/2015 |
| KR | 10-2016-0058711 A | 5/2016 |
| KR | 10-2016-0128936 A | 11/2016 |
| KR | 10-1753158 B1 | 8/2017 |
| KR | 10-2018-0116751 A | 10/2018 |
| KR | 10-2019-0001543 A | 1/2019 |
| KR | 10-2019-0001544 A | 1/2019 |
| TW | 201412930 A | 4/2014 |
| TW | 201739874 A | 11/2017 |
| WO | 2017-078036 A1 | 5/2017 |
| WO | 2017-168820 A1 | 10/2017 |

OTHER PUBLICATIONS

Translation of KR 2014-0129921 (Year: 2014).*
International Search Report issued for International Application No. PCT/KR2020/007665 dated Sep. 18, 2020, 4 page.

* cited by examiner

*Primary Examiner* — Robert C Boyle
(74) *Attorney, Agent, or Firm* — ROTHWELL, FIGG, ERNST & MANBECK, P.C.

(57) ABSTRACT

The present disclosure relates to a non-conductive film comprising an adhesive layer containing a low molecular weight epoxy resin; and a tacky layer containing a predetermined composition, and a method for manufacturing a semiconductor laminate using the non-conductive film.

13 Claims, No Drawings

NON-CONDUCTIVE FILM AND MANUFACTURING METHOD OF SEMICONDUCTOR LAMINATE

CROSS-REFERENCE WITH RELATED APPLICATION(S)

This application is a 35 U.S.C. 371 National Phase Entry Application from PCT/KR2020/007665, filed on Jun. 12, 2020 and designating the U.S., which claims the benefit of Korean Patent Application No. 10-2019-0070250 filed on Jun. 13, 2019 and Korean Patent Application No. 10-2020-0071597 filed on Jun. 12, 2020 in the Korean Intellectual Property Office, the disclosures of which are incorporated herein by reference in their entirety.

TECHNICAL FIELD

The present disclosure relates to a non-conductive film and a method for manufacturing a semiconductor laminate.

BACKGROUND OF THE INVENTION

Recently, as the tendency toward miniaturization, high functionalization, and capacity enlargement of electronic equipment has been expanding and the need for densification and high integration of the semiconductor package has rapidly increased, the size of semiconductor chips becomes larger and larger. In terms of improvement of integration degree, a stack package method for laminating chips in multi-stages has gradually increased.

In addition, recently, a semiconductor using a through silicon via (TSV) has been developed, and signal transmission through bump bonding is performed. Thermocompression bonding technology is mainly applied for the bump bonding. At this time, in the thermocompression bonding technique, the heat-curing properties of the adhesive affect the package manufacturing processability and package reliability.

A non-conductive paste (NCP) in the form of a paste was developed as an adhesive for filling between TSV layers, but there was a problem that the pitch of the bump became narrower and the filling was made difficult. To overcome this problem, non-conductive films (NCFs) implemented in the form of a film have been developed.

At the time of thermocompression bonding for bump bonding, the adhesive must be rapidly cured at high temperatures, and the curing is suppressed at room temperature, and storage stability should be good. In these adhesives, a catalyst plays an important role in controlling the degree of curing, and a thermally latent catalyst for that purpose is being developed.

In addition, in order for the adhesive film to absorb well the bump electrode level difference, a low molecular weight epoxy resin must be included in the adhesive film. However, the low molecular weight epoxy resin of the adhesive film is migrated toward a tacky film, which causes a problem that the physical properties of the adhesive film are changed, and thus, there is a need to develop a protective film for overcoming this problem.

BRIEF SUMMARY OF THE INVENTION

The present disclosure provides a non-conductive film having excellent storage stability at room temperature and having high product stability and reliability.

The present disclosure also provides a method for manufacturing a semiconductor laminate using the above-mentioned non-conductive film.

Provided herein is a non-conductive film comprising: an adhesive layer containing a low molecular weight epoxy resin; and a tacky layer, wherein the tacky layer includes a (meth)acrylate resin containing 1 to 10% by weight of a repeating unit derived from a hydroxyl group-containing acrylate monomer or oligomer; and a crosslinking agent containing an isocyanate-based compound.

Also provided herein is a method for manufacturing a semiconductor laminate, comprising laminating the above-mentioned non-conductive film on a substrate having conductive bumps or a semiconductor chip having through electrodes.

DETAILED DESCRIPTION OF THE INVENTION

Hereinafter, a non-conductive film and a method for manufacturing a semiconductor laminate according to a specific embodiment of the present disclosure will be described in more detail.

The terms used herein are used only to describe exemplary embodiments, and are not intended to limit the present disclosure. A singular expression includes a plural expression unless they have definitely opposite meanings in the context.

It should be understood that the terms "comprise", "include", and "have" as used herein are intended to designate the presence of stated features, numbers, steps, constitutional elements, or combinations thereof, but it should be understood that they do not preclude a possibility of existence or addition of one or more other features, numbers, steps, constitutional elements, or combinations thereof.

Since a variety of modification may be to the present disclosure and there may be various forms of the present disclosure, specific examples are illustrated and will be described in detail below. However, it should be understood that this is not intended to limit the present disclosure to particular forms disclosed herein, and the invention is to cover all modifications, equivalents, or alternatives falling within the spirit and technical scope of the present disclosure.

As used herein, the (meth)acrylate is meant to include both acrylate and (meth)acrylate.

According to one embodiment of the present disclosure, there can be provided an adhesive layer containing a low molecular weight epoxy resin; and a tacky layer, wherein the tacky layer includes a (meth)acrylate resin containing 1 to 10% by weight of a repeating unit derived from a hydroxyl group-containing acrylate monomer or oligomer; and a crosslinking agent containing an isocyanate-based compound.

The present inventors have found through experiments that when the tacky layer including a (meth)acrylate resin containing 1 to 10% by weight of a repeating unit derived from a hydroxyl group-containing acrylate monomer or oligomer; and a crosslinking agent containing an isocyanate-based compound is formed on the adhesive layer containing a low molecular weight epoxy resin, it suppresses the low molecular weight epoxy resin in the adhesive layer from migrating to a tacky layer and thus, the non-conductive film can have excellent storage stability at room temperature, and can realize high product stability and reliability without changing physical properties or shape, thereby completing the present disclosure.

More specifically, when the (meth)acrylate resin contains 1 to 10% by weight, or 1.5 to 8% by weight, or 2 to 6% by weight, or 2 to 5% by weight of a repeating unit derived from a hydroxyl group-containing acrylate monomer or oligomer, it prevents the low molecular weight epoxy in the adhesive layer from migrating to a tacky layer and thus, can secure a certain level or more of a degree of crosslinking for the tacky layer while maximizing the storage stability of the non-conductive film, thereby achieving an appropriate level of peel strength.

Meanwhile, when the content of the repeating unit derived from a hydroxyl group-containing acrylate monomer or oligomer in the (meth)acrylate resin is less than 1% by weight, it fails to obtain a certain degree or more of the degree of crosslinking for the tacky layer, and thus, peeling between an adhesive layer and a tacky layer after the process may be made difficult. When the content is greater than 10% by weight, there is a concern that the low molecular weight epoxy in the adhesive layer migrates to the tacky layer and the storage stability of the non-conductive film is deteriorated.

At this time, the hydroxyl group-containing acrylate monomer may be a monomer derived from primary alcohol, and for example, it may be one or more selected from the group consisting of 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethylene glycol (meth)acrylate, and 2-hydroxypropylene glycol (meth)acrylate.

Meanwhile, the (meth)acrylate resin may include a (meth)acrylate-based repeating unit having an alkyl group having 2 to 12 carbon atoms or a (meth)acrylate-based repeating unit containing a crosslinkable functional group, together with the repeating unit derived from the hydroxyl group-containing acrylate monomer or oligomer.

At this time, the (meth)acrylate resin may include 1 to 10% by weight, or 1.5 to 8% by weight, or 2 to 6% by weight, or 2 to 5% by weight of the repeating unit derived from a hydroxyl group-containing acrylate monomer or oligomer as described above, and also may include 90 to 99% by weight, or 92 to 98.5% by weight, or 94 to 98% by weight, or 95 to 98% by weight of the (meth)acrylate-based repeating unit having an alkyl group having 2 to 12 carbon atoms or the (meth)acrylate-based repeating unit containing the crosslinkable functional group.

When the (meth)acrylate resin is used in the above content range, the finally formed non-conductive film prevents the low molecular weight epoxy in the adhesive layer from migrating to the tacky layer, and can secure a certain level or more of the degree of crosslinking for the tacky layer while maximizing the storage stability of the non-conductive film, thereby achieving an appropriate level of peel strength.

The (meth)acrylate-based repeating unit having an alkyl group having 2 to 12 carbon atoms may be a repeating unit derived from one or more monomers or oligomers selected from the group consisting of pentyl(meth)acrylate, n-butyl (meth)acrylate, ethyl(meth)acrylate, hexyl(meth)acrylate, n-octyl(meth)acrylate, isooctyl(meth)acrylate, 2-ethylhexyl (meth)acrylate, dodecyl(meth)acrylate or decyl(meth)acrylate.

Specific examples of the (meth)acrylate-based repeating unit containing the crosslinkable functional group include a (meth)acrylate-based repeating unit containing a carboxyl group, a functional group containing nitrogen, and the like, and the (meth)acrylate-based repeating unit containing a crosslinkable functional group may be derived from the (meth)acrylate-based monomer containing a crosslinkable functional group.

At this time, examples of the carboxyl group-containing (meth)acrylate-based monomer include (meth)acrylic acid, and the like, and examples of the (meth)acrylate-based monomer containing a functional group including nitrogen include (meth)acrylonitrile, N-vinyl pyrrolidone, N-vinyl caprolactam, or the like, but are not limited thereto.

The (meth)acrylate resin may have a weight average molecular weight of 100,000 to 1,500,000, preferably 200,000 to 1,000,000. When the weight average molecular weight of the (meth)acrylate resin is less than 100,000, the coating property or cohesive force may be lowered, residues remain on an adherend at the time of peeling, or a breakage phenomenon of a tacky agent may occur. Further, when the weight average molecular weight of the (meth)acrylate resin exceeds 1,500,000, the viscosity is high and thus, an excessive amount of dilution solvent must be added and coating properties may be deteriorated.

The weight average molecular weight means a weight average molecular weight in terms of polystyrene measured by GPC method.

Further, the (meth)acrylate-based resin may also further include a vinyl acetate, styrene or acrylonitrile carbon-carbon double bond-containing low molecular weight compound, etc. from the viewpoint of improving other functionalities such as compatibility.

Meanwhile, the tacky layer may include a crosslinking agent containing an isocyanate-based compound, and the crosslinking agent containing an isocyanate-based compound in the tacky layer may be contained in an amount of 1 to 10% by weight, or 3 to 9% by weight, or 3 to 8% by weight, or 3 to 7% by weight with respect to the (meth)acrylate resin.

The crosslinking agent containing the isocyanate-based compound serves to enhance a cohesive force of a tacky agent in the tacky layer and to control the peel strength. At this time, when the crosslinking agent containing an isocyanate-based compound in the tacky layer is included in the above range, an appropriate level of peel strength can be secured, which is preferable.

When the content of the crosslinking agent containing the isocyanate-based compound is less than 1% by weight with respect to the (meth)acrylate resin, the cohesive force of the tacky layer may be insufficient and thus, residues may remain, or peeling between the protective film and non-conductive film (NCF) may be made difficult. When the content is greater than 10% by weight, the peel strength between the protective film and the non-conductive film (NCF) becomes too low, so that the protective film may be peeled off from the non-conductive film (NCF) during the process.

The isocyanate-based compound is not particularly limited as long as it has two or more isocyanate groups in its molecule, and for example, it may include at least one selected from the group consisting of tolylene diisocyanate, xylene diisocyanate, diphenylmethane diisocyanate, hexamethylene diisocyanate, isoformdiisocyanate, tetramethylxylene diisocyanate and naphthalene diisocyanate, and a reactant with any one polyol of the above (for example, trimethylol propane).

Meanwhile, the tacky layer may include a thermal curing-type tacky agent. In the case of the thermal curing-type tacky agent, the cohesive force is reduced by applying temperature.

Further, the tacky layer may further include a polyfunctional (meth)acrylate compound.

The polyfunctional (meth)acrylate compound has a weight average molecular weight of 100 to 100,000, and may include one or more selected from the group consisting of polyfunctional urethane (meth)acrylate and polyfunctional (meth)acrylate monomer or oligomer.

The weight average molecular weight means a weight average molecular weight in terms of polystyrene measured by GPC method.

The tacky layer may further include at least one cross-linking agent selected from the group consisting of aziridine compounds, epoxy compounds and metal chelate compounds.

The tacky layer may further include at least one tackifier selected from the group consisting of rosin resin, terpene resin, phenol resin, styrene resin, aliphatic petroleum resin, aromatic petroleum resin, and aliphatic aromatic copolymerized petroleum resin.

The method of coating and drying the tacky agent composition forming the tacky layer is not particularly limited, and for example, a method of coating the composition containing each of the above components as it is, or of diluting the composition with a suitable organic solvent, coating it by a known means such as a comma coater, gravure coater, die coater or reverse coater, and then drying the solvent at a temperature of 60 to 200° C. for 10 seconds to 30 minutes can be used. In addition, in the above process, an aging step for advancing a sufficient crosslinking reaction of the tacky agent can be additionally performed.

Meanwhile, the thickness of the tacky layer is not particularly limited, but may be 5 to 50 μm, or 7 to 40 μm, or 10 to 30 μm.

When the tacky layer satisfies the thickness range, it is easy to peel off without tacky adhesion and residues on the surface of the non-conductive film (NCF). However, when the thickness of the tacky layer is out of the above range, it is difficult to obtain a uniform tacky layer, and the physical properties of the film may be uneven.

When the thickness of the tacky layer is less than 5 μm, there is a problem that the thickness of the layer is too thin, which cause a problem that uniform coating is difficult and the cohesive force is decreased. Conversely, when the thickness is greater than 50 μm, there may be a problem that the cohesive force becomes high due to excessive thickness, or residues remain on the surface of the non-conductive film (NCF) at the time of removing the tacky layer.

Meanwhile, the non-conductive film according to the embodiment of the present disclosure may include an adhesive layer including a low molecular weight epoxy resin.

At this time, the low molecular weight epoxy resin is a resin having one or more epoxy groups in the molecule while having a molecular weight of less than 500 g/mol.

More specifically, the low molecular weight epoxy resin may have a weight average molecular weight of 150 to 450 g/mol, or 250 to 400 g/mol.

The non-conductive film may be distinguished from other types of films for semiconductor process including an epoxy resin having a relatively high molecular weight, including a low molecular weight epoxy resin having a weight average molecular weight as described above.

In particular, as the adhesive layer of the non-conductive film contains the low molecular weight epoxy resin, conductive bumps formed on a substrate or semiconductor chip applied to a semiconductor fabrication process using a through silicon via (TSV) can be more easily embedded.

More specifically, the adhesive layer containing the low molecular weight epoxy resin may have a melt viscosity of 100 Pa·s to 10,000 Pa·s as measured by applying a shear rate of 10 Hz and a temperature rising rate of 10° C./min. As the adhesive layer has such a melt viscosity, the embedding of the conductive bump formed on the substrate or semiconductor chip performed at high temperature may be smoother, and the generation of voids may be prevented, thereby increasing the manufacturing processability and the reliability of the final product.

If the molecular weight of the low molecular weight epoxy resin is 500 g/mol or more, there is a concern that the film becomes too brittle and breaks during the cutting of the film or during the dicing process, and that the entire area around the bump is not filled, voids may occur, and the reliability is reduced.

The low molecular weight epoxy resin as described above forms cross-linked hard structure through a curing process, and thus can exhibit excellent adhesiveness, heat resistance, and mechanical strength. In one example, as the epoxy resin, an epoxy resin having an average epoxy equivalent of 180 to 1,000 may be used. When the epoxy equivalent of the epoxy resin is less than 180, the crosslinking density becomes too high, and the adhesive layer exhibits hard properties as a whole. When the epoxy equivalent is greater than 1,000, there is a fear that the heat resistance is lowered.

Specifically, the epoxy resin may be one or more selected from the group consisting of bisphenol-based epoxy resin, biphenyl-based epoxy resin, naphthalene-based epoxy resin, fluorene-based epoxy resin, glycidylamine type epoxy resin, trishydroxylphenylmethane epoxy resin, tetraphenylmethane-based epoxy resin, dicyclopentadiene type epoxy resin, and dicyclopentadiene modified phenol type epoxy resin.

Here, the bisphenol-based epoxy resin may include bisphenol A type epoxy resin, bisphenol F type epoxy resin, bisphenol S type epoxy resin, hydrogenated bisphenol A type epoxy resin, bisphenol AF type epoxy resin, and the like.

Meanwhile, according to an embodiment of the present disclosure, the adhesive layer may further include a thermoplastic resin, a thermosetting resin, a curing agent, an inorganic filler, and a catalyst.

As the thermoplastic resin, thermosetting resin, curing agent, inorganic filler and catalyst included in the adhesive layer, conventional components known to be used in the adhesive layer composition in the field of non-conductive films may be used.

The type of the thermoplastic resin is not particularly limited, and for example, it may include at least one polymer resin selected from the group consisting of polyimide, polyether imide, polyester imide, polyamide, polyether sulfone, polyether ketone, polyolefin, polyvinyl chloride, phenoxy, reactive butadiene acrylonitrile copolymerized rubber and (meth)acrylate resin.

Further, examples of the thermosetting resin are not particularly limited, and for example, an epoxy resin may be preferably used as the thermosetting resin.

As the curing agent, a compound known to function as a curing agent for the thermosetting resin can be used. More specifically, the curing agent may include at least one compound selected from the group consisting of amine-based curing agents and acid anhydride-based curing agents.

As the curing agent, a novolac-based phenol resin can be preferably applied.

The novolac-based phenol resin has a chemical structure in which a ring is located between reactive functional groups. Due to these structural characteristics, the novolac-based phenol resin can further reduce the hygroscopicity of the adhesive layer composition, and in the high-temperature IR reflow process, the stability can be further improved, which can serve to prevent the peeling phenomenon of the adhesive layer or reflow cracking.

Specific examples of the novolac-based phenol resin include one or more selected from the group consisting of novolac phenolic resin, Xylok novolac phenol resin, cresol novolac phenol resin, biphenyl novolac phenol resin, bisphenol A novolac phenol resin, and bisphenol F novolac phenol resin.

Meanwhile, as the inorganic filler, one or more inorganic particles selected from the group consisting of is alumina, silica, barium sulfate, magnesium hydroxide, magnesium carbonate, magnesium silicate, magnesium oxide, calcium silicate, calcium carbonate, calcium oxide, aluminum hydroxide, aluminum nitride, and aluminum borate may be used.

Further, the catalyst functions to accelerate the action of the curing agent or the curing of the adhesive layer composition, and catalysts known to be used in the adhesive layer composition can be used without particular limitation. For example, as the catalyst, one or more selected from the group consisting of phosphorus-based compounds, boron-based compounds, and phosphorus-boron-based compounds and imidazole-based compounds may be used.

Meanwhile, the thickness of the adhesive layer is not particularly limited, but may be appropriately adjusted within the range of 5 to 40 μm, or 8 to 30 μm.

When the thickness of the adhesive layer is less than 5 μm, there may be a problem that the reliability is lowered because it does not fill the entire area around the bump. Conversely, when the thickness is greater than 40 μm, there may be a problem that the connection between the bump and the pad is difficult or the semiconductor package becomes thick.

Meanwhile, the peel strength of the tacky layer on the adhesive layer may be 10 g/25 mm to 60 g/25 mm, or 15 g/25 mm to 55 g/25 mm, or 20 g/25 mm to 50 g/25 mm as measured at a peel angle of 180 degrees and a peel rate of 300 mm/min.

When the peel strength of the tacky layer on the adhesive layer exceeds 60 g/25 mm, there may be a problem that peeling is difficult at the time of peeling the protective film from the non-conductive film (NCF) after the process. Conversely, when the peel strength of the tacky layer on the adhesive layer is less than 10 g/25 mm, there may be a problem that during the process, the protective film does not adhere well to the non-conductive film (NCF) and detaches.

The non-conductive film may further include a release film formed on the other one surface of the tacky layer to face the adhesive layer.

The specific example of the release film is not particularly limited, and polyester films such as PET and polyolefin films such as PE and PP can be used.

The release film may be removed after laminating the non-conductive film on a substrate having a conductive bump or a semiconductor chip including a through electrode.

Meanwhile, according to another embodiment of the present disclosure, there can be provided a method for manufacturing a semiconductor laminate, comprising laminating the non-conductive film of the above-mentioned embodiment on a substrate having conductive bumps or a semiconductor chip having through electrodes Specifically, the non-conductive film of the embodiment is attached on the surface of a bumped wafer by a vacuum lamination, separated into individual chips by a dicing process, and the bump chip to which the individualized non-conductive film is attached is subjected to thermocompression bonding using a thermocompression bonder.

Subsequently, depending on the application, additional compression bonding process and molding process, and individualization steps of the molding wafer may be additionally applied.

Advantageous Effects

According to the present disclosure, a non-conductive film having excellent storage stability at room temperature and having high product stability and reliability, and a method for manufacturing a semiconductor laminate using the non-conductive film can be provided.

Specific embodiments of the present disclosure are described in more detail with reference to the following examples. However, these examples are provided for illustrative purposes only, and should not be construed as limiting the scope of the present disclosure.

Preparation Example 1: Preparation of (Meth)Acrylate Resin

Preparation Example 1-1

97.5 g of 2-ethylhexyl acrylate (2-EHA), 2.5 g of 4-hydroxybutyl acrylate HBA), 0.1 g of benzoyl peroxide as a polymerization initiator, and 170 g of methyl ethyl ketone (MEK) were used to prepare 270 g of (meth)acrylate resin.

Preparation Example 1-2

97 g of 2-ethylhexyl acrylate (2-EHA), 3 g of 2-hydroxyethyl acrylate (2-HEA), 0.1 g of benzoyl peroxide and 170 g of methyl ethyl ketone (MEK) were used to prepare 270 g of (meth)acrylate resin.

Preparation Example 1-3

93 g of 2-ethylhexyl acrylate (2-EHA), 1 g of 2-hydroxyethyl acrylate (2-HEA), 6 g of 4-hydroxybutyl acrylate (4-HBA), 0.1 g of benzoyl peroxide as a polymerization initiator, and 170 g of methyl ethyl ketone (MEK) were used to prepare 270 g of (meth)acrylate resin.

Preparation Example 1-4

99 g of 2-ethylhexyl acrylate (2-EHA), 1 g of 2-hydroxypropyl acrylatee (2-HPA), 0.1 g of benzoyl peroxide as a polymerization initiator, and 170 g of methyl ethyl ketone (MEK) were used to prepare 270 g of (meth) acrylate resin.

Preparation Example 2: Preparation of Adhesive Layer 50 g of bisphenol F type epoxy resin (KDS-8170, Kukdo Chemical, molecular weight: 340 g/mol) as a low molecular weight epoxy resin, 40 g of biphenyl novolac epoxy resin (NC-3000H, Nippon Kayaku, epoxy equivalent: 288 g/eq, softening point: 70) as an epoxy resin, 70 g of phenol resin KPH-F3075 (Kolon Chemical, hydroxyl group equivalent: 175 g/eq, softening point 75), 40 g of thermoplastic acrylate resin KG-3015 (Negami Chemical), 0.5 g of 2-phenyl-4-methyl-5-dihydroxymethyl imidazole (2P4MHZ, Shikoku Kasei) as a catalyst, and 70 g of tiller SC1050 (spherical silica, average particle diameter: 0.3 μm) were dissolved in methyl ethyl ketone to give an adhesive layer composition (concentration of solid content: 35 wt %).

The prepared adhesive layer composition was coated onto a polyethylene terephthalate film (38 μm thick), and then dried at 110° C. for 5 minutes to give a 20 μm thick adhesive layer.

The above adhesive layers were superimposed, and laminated until it reached 320 μm, and then measurement was performed by applying a shear rate of 10 Hz and a temperature rising rate of 10° C./min using Anton Parr MCR302, and the minimum value for the measured result was determined by the melt viscosity.

Example 1: Preparation of Non-Conductive Film (1) Preparation of Tacky Layer Composition 100 g of (meth)acrylate resin prepared in Preparation Example 1-1, 2.5 g of MHG-80B (Asahi Kasei) as a cross-linking agent (the content of crosslinking agent compared to the (meth)acrylate resin solid content was 5 wt %) and 1.1 mg of DBTDL were mixed to prepare a tacky layer composition.

(2) Preparation of Non-Conductive Film

The tacky layer composition was coated onto the release PET, and allowed to stand in an oven at a temperature of 110° C. for 3 minutes to form a tacky layer having a thickness of 20 μm, which was then attached to the upper part of the adhesive layer prepared in Preparation Example 2 to manufacture a non-conductive film including an adhesive layer and a tacky layer.

Example 2 and Comparative Examples 1 to 6

A non-conductive film was manufactured in the same manner as in Example 1, except that the tacky layer composition was prepared by combining the components used in Table 1 below

TABLE 1

| | Tacky layer composition | |
|---|---|---|
| Category | Resin component | Content of crosslinking agent |
| Example 1 | Preparation Example 1-1 | 5 wt % |
| Example 2 | Preparation Example 1-2 | 5 wt % |
| Comparative Example 1 | Preparation Example 1-3 | 15 wt % |
| Comparative Example 2 | Preparation Example 1-3 | 5 wt % |
| Comparative Example 3 | Preparation Example 1-4 | 5 wt % |
| Comparative Example 4 | Preparation Example 1-2 | 10 wt % |
| Comparative Example 5 | Preparation Example 1-1 | 2 wt % |

* Crosslinking agent: MHG-80B (Asahi Kasei)

[Test Example]

The physical properties of the non-conductive films prepared in Examples and Comparative Examples were evaluated by the following methods, and the results are shown in Table 2 below.

(1) Measurement of Peel Strength

For measuring the peel strength between the tacky layer and the adhesive layer, the non-conductive films prepared in Examples 1 to 2 and Comparative Examples 1 to 5 were left at room temperature for 1 hour, and then a sample having a width of 25 mm was prepared to measure a peel strength at room temperature. The peel strength was measured using a texture analyzer at a peel angle of 180 degrees and a peel rate of 300 mm/min.

The peel strength was measured three times or more for each sample, and the average value was obtained.

(2) Comparison of Storage Stability-Measurement of Change Rate of Calorific Value For the adhesive layer prepared in Preparation Example 2, the initial calorific value of the adhesive layer was measured by area at the curing temperature using a differential thermal analyzer (DSC).

Then, the tacky layer composition was coated onto the upper part of the adhesive layer to prepare the non-conductive films of Examples 1 to 2 and Comparative Examples 1 to 5 including an adhesive layer and a tacky layer, and then the prepared non-conductive film was left at 60° C. for 24 hours.

Then, the non-conductive film was separated into an adhesive layer and a tacky layer, and then the calorific value was measured for the adhesive layer using a differential thermal analyzer (DSC).

The rate of change was calculated using the following Equation 1.

Rate of change (%)=[(Peak area of initial adhesive layer−Peak area after left at 60° C. for 24 hours)/Peak area of initial adhesive layer]×100   [Equation 1]

Evaluation of Void

Through the Scanning Acoustic Tomography (SAT), it was evaluated as acceptable (O) if the area occupied by voids between bump chips was 1% or less, and as unacceptable (X) if it is greater than 1%.

TABLE 2

| | Peel strength (g/25 mm) | Change rate of calorific value (%) | Evaluation of void |
|---|---|---|---|
| Example 1 | 35 | 11 | O |
| Example 2 | 28 | 14 | O |
| Comparative Example 1 | 12 | 26 | X |
| Comparative Example 2 | 20 | 21 | X |
| Comparative Example 3 | 150 | 8 | O |
| Comparative Example 4 | 23 | 17 | X |
| Comparative Example 5 | 68 | 9 | O |

As shown in Table 2, it was confirmed that in the non-conductive films provided in Examples 1 and 2, the peel strength of the tacky layer on the adhesive layer satisfies the range of 10 g/25 mm to 60 g/25 mm, the detachment problem of the tacky layer on the adhesive layer is reduced when performing the process, and the pick-up success rate increases when the tacky layer and the adhesive layer are peeled off.

In addition, it was confirmed that the non-conductive films provided in Examples 1 and 2 have a low rate of change when stored at room temperature, and thus have excellent storage stability at room temperature, and the adhesive film absorbs the bump electrode level difference, so that voids do not actually occur during the bonding of bump chips.

The invention claimed is:

1. A non-conductive film comprising: an adhesive layer and a tacky layer, wherein the adhesive layer includes a low molecular weight epoxy resin;

wherein the tacky layer includes a (meth)acrylate resin containing 1 to 10% by weight of a repeating unit derived from a hydroxyl group-containing acrylate monomer or oligomer; and a crosslinking agent containing an isocyanate-based compound; and wherein a peel strength of the tacky layer on the adhesive layer is 10 g/25 mm to 60 g/25 mm as measured at a peel angle of 180 degrees and a peel rate of 300 mm/min.

2. The non-conductive film according to claim 1, wherein the non-conductive film is for a semiconductor fabrication process using a through silicon via (TSV).

3. The non-conductive film according to claim 1, wherein the low molecular weight epoxy resin has a weight average molecular weight of 150 to 450 g/mol.

4. The non-conductive film according to claim 1, wherein the (meth)acrylate resin further includes a (meth)acrylate-based repeating unit having an alkyl group having 2 to 12 carbon atoms or a (meth)acrylate-based repeating unit containing a crosslinkable functional group.

5. The non-conductive film according to claim 4, wherein the (meth)acrylate resin includes include 1 to 10% by weight of the repeating unit derived from a hydroxyl group-containing acrylate monomer or oligomer; and 90 to 99% by weight of the (met)acrylate-based repeating unit having an alkyl group having 2 to 12 carbon atoms or the (meth)acrylate-based repeating unit containing a crosslinkable functional group.

6. The non-conductive film according to claim 1, wherein the hydroxyl group-containing acrylate monomer includes one or more selected from the group consisting of 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethylene glycol (meth)acrylate, and 2-hydroxy propylene glycol (meth)acrylate.

7. The iron-conductive film according to claim 1, wherein the crosslinking agent containing an isocyanate-based compound in the tacky layer is contained in an amount of 1 to 10% by weight with respect to the (meth)acrylate resin.

8. The non-conductive film according to claim 1, wherein the isocyanate-based compound includes at least one selected from the group consisting of tolylene diisocyanate, xylene diisocyanate, diphenylmethane diisocyanate, hexamethylene diisocyanate, isophorone diisocyanate, tetramethylxylene diisocyanate and naphthalene diisocyanate.

9. The non-conductive film according to claim 1, wherein a thickness of the tacky layer is 5 to 50 μm.

10. The non-conductive film according to claim 1, wherein a thickness of the adhesive layer is 5 to 40 μm.

11. The non-conductive film according to claim 1, wherein the adhesive layer has a melt viscosity of 100 Pa·s to 10,000 Pa·s as measured by applying a shear rate of 10 Hz and a temperature rising rate of 10° C./min.

12. The non-conductive film according to claim 1, further comprising a release film.

13. A method for manufacturing a semiconductor laminate, comprising laminating the non-conductive film of claim 1 on a substrate having a conductive bump or a semiconductor chip having a through electrode.

* * * * *